(12) United States Patent
Velazquez (10) Patent No.: US 6,424,275 B1
(45) Date of Patent: Jul. 23, 2002

(54) LINEARITY ERROR COMPENSATOR

(76) Inventor: Scott R. Velazquez, 7042 Nighthawk Ct., Carlsbad, CA (US) 92009

( * ) Notice: Subject to any disclaimer, the term of this patent is extended or adjusted under 35 U.S.C. 154(b) by 0 days.

(21) Appl. No.: 10/026,254

(22) Filed: Dec. 21, 2001

Related U.S. Application Data (63) Continuation of application No. 09/765,479, filed on Jan. 18, 2001, now Pat. No. 6,344,810.

(51) Int. Cl.[7] ................................................. H03M 1/06
(52) U.S. Cl. ........................................ 341/118; 341/120
(58) Field of Search ................................... 341/118, 120

(56) References Cited

U.S. PATENT DOCUMENTS 6,198,416 B1 * 3/2001 Velazquez .................. 341/118

* cited by examiner

*Primary Examiner*—Peguy JeanPierre
*Assistant Examiner*—Joseph Lauture (57) ABSTRACT

In one aspect, the present invention is directed to a compensator for compensating linearity errors, such as harmonic distortion and intermodulation distortion, in devices. The compensator includes a means for phase-shifting and a means for exponentiation to generate a compensation signal such that the linearity error distortion signals are canceled in the system output while maintaining the desired fundamental signal. Another aspect of the invention is directed to methods for adaptively calibrating the linearity error compensator.

7 Claims, 8 Drawing Sheets

LINEARITY ERROR COMPENSATOR

RELATED APPLICATIONS

This application is a continuation application of U.S. patent application Ser. No. 09/765,479, filed Jan. 18, 2001, now U.S. Pat. No. 6,344,810, the contents which are incorporated by reference.

FIELD OF THE INVENTION

The present invention relates generally to a method and apparatus for linearity error compensation in electronic devices, and more particularly to phase-shift exponential processing methods and apparatus for compensating linearity errors (such as harmonic or intermodulation distortion).

BACKGROUND OF THE INVENTION

Linearity errors, also known as nonlinear distortion, in electronic devices are caused by many different factors, primarily in the analog electronics of a system, such as buffer amplifiers, power amplifiers, sample-and-hold amplifiers, analog-to-digital converters, digital-to-analog converters, or electro-mechanical components such as microphones and loudspeakers. These devices introduce nonlinear effects into the system such as asymmetry in the input/output function, clipping, overloading effects, harmonic distortion, and intermodulation distortion.

For example, although the output y of an ideal amplifier is related to its input x by the linear equation $y=gx$ (where g is the gain of the amplifier), the relationship between the input and output of a real amplifier is characterized by the equation $y=a_0+a_1x+a_2x^2+a_3x^3+\ldots$, where the exponential terms (e.g., $a_2x^2$, $a_3x^3$) represent nonlinear distortion introduced by the real amplifier. Other real signal processing devices introduce similar nonlinear distortion into their output. As a result, the outputs of real signal processing devices differ from the desired, ideal outputs.

Linearity errors in electronics severely limit the performance of systems. Linearity errors typically increase as the speed or bandwidth of the device is increased, which limits the resolution or dynamic range of the device. Designers typically face the challenge of trading off resolution of the device with its speed. Increasing the speed and resolution of electronics can offer numerous advantages, including the following: improved dynamic range which increases call capacity in cellular communications systems; increased modulation density (such as larger Quadrature Amplitude Modulation grid spacing) for wider bandwidth digital communications; wideband analog-to-digital conversion or digital-to-analog conversion for compact, universal software-reconfigurable transceivers; improved accuracy of Radar systems and medical imaging equipment; improved speech recognition by compensating for linearity errors in microphones; and high-performance test equipment such as oscilloscopes, spectrum analyzers, or data acquisition systems.

Many electronic systems such as receivers and test equipment use filtering to compensate for gain and phase errors across frequency. A pseudo-random noise signal is periodically injected into the system and the output is re-calibrated for constant gain and phase performance. Since this prior art technique uses a linear filtering operation, it does not correct nonlinear distortion and therefore does not improve the dynamic range.

A common prior art technique for reducing linearity errors is by adding noise or "dither" to the system to essentially randomize the nonlinear distortion. Statistically, dither signals can cause the nonlinear distortion to be signal independent, uniformly distributed white noise. This technique can offer up to 10 dB reduction in harmonic and intermodulation distortion, but at the expense of increasing the noise in the system, which decreases the signal-to-noise ratio.

Another prior art technique for linearity error compensation is a static look-up table (such as a read-only memory) to correct the digital signal. The static look-up table is a two-column table, where the first column contains amplitudes of all possible output signals output by the signal processing device, and where the second column contains the corresponding desired corrected output signal amplitudes. When the signal processing device produces an output signal, the output signal's amplitude is used as an index into the static compensation table, which outputs the corresponding corrected output value. This technique is effective for errors caused by resistor component variance in the comparator ladder of analog-to-digital converters and can provide up to 10 dB reduction in harmonic distortion. However, most current high-performance converters use laser trimmed resistors, so this type of error is minimal. In addition, researchers have realized that this type of correction improves the dynamic range of the converter only near the calibration frequency. The static compensation table can be as large as the number of digital states (for example, an n-bit analog-to-digital converter has $2^n$ digital states) so a 12-bit analog-to-digital converter requires a compensation table of up to 4096 memory bins.

Figure 1:
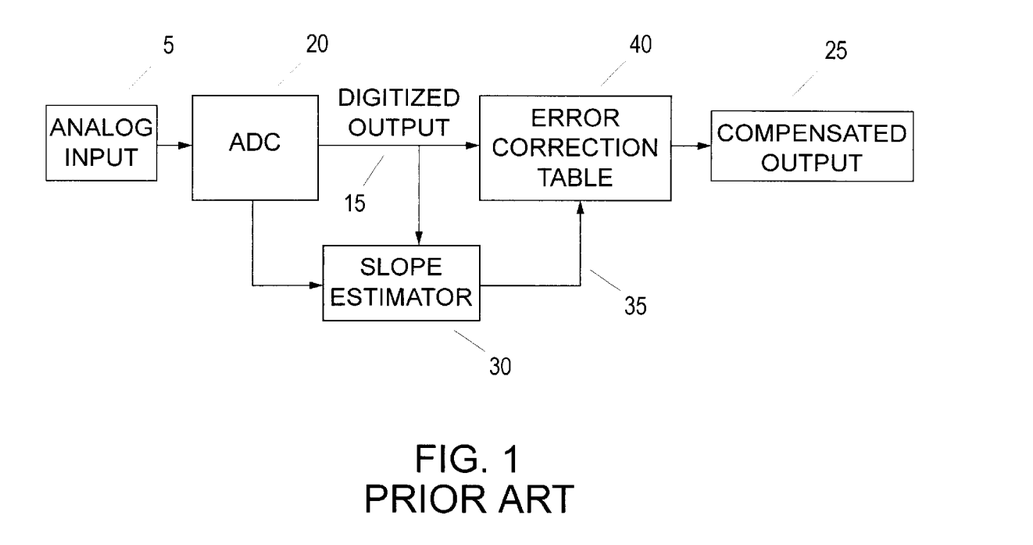
FIG. 1 is a block diagram of the prior art phase-plane compensation used to compensate an analog-to-digital converter.

Referring to FIG. 1, another prior art technique for linearity error compensation is phase-plane compensation 10, which is a dynamic approach since it accounts for errors that are a function of both amplitude and frequency. Like static compensation, a look-up table 40 is used to correct the digitized samples 15, but in this case, the lookup table 40 is indexed by the digital signal 15 and the estimated slope 35 of the signal (to account for frequency), as shown in FIG. 1. This technique accomplishes all that static compensation does but yields improved performance for its ability to compensate errors that are a function of frequency. This technique typically provides 10–15 dB reduction in harmonic distortion. This technique is more hardware-intensive than static compensation since it needs to estimate the slope of the signal 5 and use the slope to index a larger look-up table 40. For this technique, there is essentially one static compensation table for each slope. So if there are M slopes, each slope getting its own static table, then the size of the table 40 is $M \times 2^n$.

A typical compensation table for an 8-bit device may occupy 32,768 memory bins (256 amplitudes, 128 slopes). Also, inaccurate slope estimates significantly degrade the performance. In addition, this technique is not suitable for super-Nyquist input frequencies (signals above the Nyquist frequency) due to the ambiguity in the slope. Super-Nyquist compensation is necessary in receiver applications that use intermediate frequency (IF) sampling to alias desired signals down to baseband without the use of mixers (which are typically inaccurate and bulky).

Another prior art technique for linearity error compensation is polynomial compensation, for example, as disclosed in U.S. Pat. No. 5,594,612 to Henrion. This technique uses a polynomial power series to compensate for linearity errors by adjusting the polynomial coefficients to minimize the amplitude of the linearity errors. For example, the output signal, x, of a device is processed with a polynomial power series, $y=a_0+a_1x+a_2x^2+a_3x^3+\ldots$, to output a compensated signal, y; the polynomial coefficients $a_0$, $a_1$, . . . , are iteratively adjusted and the system output is monitored until the linearity errors are below a certain threshold. However, this technique assumes that the linearity errors generated by the device being compensated are accurately modeled with the polynomial power series. An important parameter missing in this model is the phase-shift of the higher-order linearity error distortion terms (e.g., $a_2x^2$, $a_3x^3$); the level of attenuation of the linearity errors suffers greatly without accounting for phase-shift since this technique assumes that the device generates linearity errors which are either in-phase or out-of-phase with the desired fundamental signal. Many devices generate linearity errors with arbitrary phase-shift, so accurately accounting for the phase-shift of the linearity errors in the device is necessary for accurate compensation. In addition, the polynomial compensation technique does not accurately compensate linearity errors over a wide range of input frequencies, since the polynomial model cannot accurately model linearity errors that change over frequency. Also, the polynomial compensation technique uses integer exponentials, which may not accurately model the linearity errors of the device.

SUMMARY OF THE INVENTION

Embodiments of the present invention are directed to methods and apparatus for providing linearity error compensation that overcome drawbacks of the prior art discussed above. Unlike the prior art gain/phase calibration, the present invention provides gain/phase calibration in addition to linearity error compensation. Unlike the prior art dither method, the present invention provides linearity error compensation without increasing the noise. Unlike the prior art static compensation, the present invention provides linearity error compensation across a wide range of frequencies. Unlike the prior art phase-plane compensation 10, the present invention does not require slope estimates and is capable of super-Nyquist error compensation; the present invention's $k^{th}$ order phase-shift exponential model uses approximately k amplitude factors and k phase-shift factors to model the system, where k is typically in the range of 3 to 5, which is much less memory than required by phase-plane compensation. Unlike prior art polynomial compensation, the present invention uses phase-shift to accurately cancel the linearity errors, uses frequency-dependent processing to cancel linearity errors over a wide range of frequency, and may use non-integer exponentials to more accurately model and cancel the linearity errors.

In one general aspect, the invention features a compensator for compensating linearity errors in a device generating a fundamental signal and linearity error distortion signals. The compensator includes an exponentiator for generating a compensation signal and a phase-shifting unit for introducing a phase-shift between the fundamental signal and the compensation signal such that the linearity error distortion signals are canceled and the fundamental signal is maintained.

In another general aspect, the exponentiator in the compensator includes a power unit for generating an exponentiated compensation signal. The power unit may be used to generate an integer or non-integer exponentiated signal. Frequency-dependent gain units for adjusting the exponentiated compensation signals amplitude may be connected to the power unit or to the phase-shift unit or both. An adder may be included to combine the exponentiated compensation signals.

In another general aspect, the compensator includes a set of adders connected to a set of the phase-shifting units for adding a set of compensation elements to generate a set of factored compensation signals. The exponentiation is accomplished with a multiplier to combine the set of factored compensation signals. Frequency-dependent gain units for adjusting each factored compensation signal's amplitude may be connected to each phase-shifting unit or each adder or both.

In yet another general aspect, the compensator includes an adder connected to the phase-shifting unit for adding a compensation element to generate a factored compensation signal. The exponentiation includes a power unit for generating an exponentiated compensation signal and a multiplier for combining the factored compensation signal and the exponentiated compensation signal.

In still another general aspect, the invention features a frequency-dependent phase-shifting unit. In even another general aspect, the phase-shifting unit's compensation parameters or the exponentiator's compensation parameters are adjusted according to the amplitude of the fundamental signal.

In another general aspect, the compensator is connected to the device and the compensator precedes the device. The device may include a digital-to-analog converter. Alternatively, in another general aspect, the compensator is connected to the device and the compensator follows the device. The device may include an analog-to-digital converter.

In still another general aspect, the compensator's phase-shifting unit's compensation parameters and the exponentiator's compensation parameters are calibrated according to the measured amplitude and phase of the fundamental signal and linearity error distortion signals.

In even another general aspect, the invention features a compensation system for compensating linearity errors including a device for generating a fundamental signal and linearity error distortion signals, an exponentiator for generating a compensation signal, and a phase-shifting unit for introducing a phase-shift between the fundamental signal and the compensation signal such that the linearity error distortion signals are canceled and the fundamental signal is maintained. The phase-shifting unit's compensation parameters and the exponentiator's compensation parameters are calibrated according to the measured amplitude and phase of the fundamental signal and linearity error distortion signals.

In yet another general aspect, the invention features a model for modeling linearity errors in a device generating a fundamental signal and linearity error distortion signals including an exponentiator for generating a modeling signal and a phase-shifting unit for introducing a phase-shift between the fundamental signal and the modeling signal. The phase-shifting unit's model parameters and the exponenitiator's model parameters are calculated according to the measured amplitude and phase of the fundamental signal and linearity error distortion signals.

In another general aspect, the invention features a method for calibrating a compensation system that cancels linearity error distortion signals generated by a device and maintains a fundamental signal generated by the device. The method of calibrating includes steps of injecting test signals into the compensation system, measuring the amplitude and phase of the linearity error distortion signals and the fundamental signal, and calculating a set of compensator coefficients. The step of calculating the set of compensator coefficients includes solving for a set of phase-shifting compensation parameters and a set of exponentiator compensation parameters.

The step of calculating the set of compensator coefficients may include a step ignoring linearity error distortion signals with amplitudes smaller than a pre-determined threshold.

In even another general aspect, the step of calculating the set of compensator coefficients may include a step of repeating the step of calculating the set of compensator coefficients to generate several sets of compensator coefficients for a cascaded compensator. The method may include a step of mathematically combining the several sets of compensator coefficients into a single combined set of compensator coefficients for a non-cascaded compensator having substantially the same performance as the cascaded compensator.

In still another general aspect, the step of calculating a set of compensator coefficients includes a step of setting the phase-shifting compensation parameters to be substantially equivalent to the measured phase of the linearity error distortion signals and setting the amplitudes of the corresponding exponentiator compensation parameters to be the approximate negative of the measured amplitude of the linearity error distortion signal.

In another general aspect, the step of injecting test signals into the compensation system includes a step of injecting one or more sinusoidal test signals, and the step of measuring the amplitude and phase of the linearity error distortion signals and the fundamental signal includes a step of using trigonometric identities to convert powers of sinusoidal functions to sinusoidal functions of harmonics.

In yet another general aspect, the step of calculating a set of compensator coefficients includes iteratively optimizing the set of phase-shifting compensation parameters and the set of exponentiator compensation parameters.

In another general aspect, the invention features a method of compensating linearity errors in a device generating a fundamental signal and linearity error distortion signals. The method includes steps of exponentiating a compensation signal to generate an exponentiated compensation signal and phase-shifting the compensation signal or the exponentiated compensation signal to introduce a phase-shift between the fundamental signal and the exponentiated compensation signal such that the linearity error distortion signals are canceled and the fundamental signal is maintained.

In even another general aspect, the step of exponentiating comprises a step of using a power method to generate the exponentiated compensation signal. Also, the step of using a power method includes using an integer power method to generate an integer exponentiated signal or using a non-integer power method to generate a non-integer-exponentiated signal.

In still another general aspect, the step of exponentiating includes a step of adjusting the amplitude of the exponentiated compensation signal based on the frequency of the fundamental signal.

In yet another general aspect, the step of phase-shifting includes several steps of phase-shifting and the step of exponentiating includes several steps of using a power method to generate a several exponentiated compensation signals. The method may further a step of adding the several of exponentiated compensation signals together.

In another general aspect, the step of phase-shifting includes several steps of phase-shifting to generate several phase-shifted compensation signals. The method further includes a step of adding several compensation elements to the several phase-shifted compensation signals to generate several factored compensation signals. The step of exponentiating includes multiplying the several factored compensation signals.

In yet another general aspect, the step of phase-shifting includes generating a phase-shift based on the frequency of the fundamental signal. Also, the step of phase-shifting may include adjusting the phase-shift compensation parameters according to the amplitude of the fundamental signal or the step of exponentiating may include adjusting the exponentiation compensation parameters according to the amplitude of the fundamental signal.

In even another general aspect, the compensation signal is the output of the device. The device may be for converting signals from analog to digital.

In another general aspect, the invention features a method of compensating linearity errors. The method includes steps for generating a fundamental signal and linearity error distortion signals, exponentiating a compensation signal to generate an exponentiated compensation signal, and phase-shifting the compensation signal or the exponentiated compensation signal to introduce a phase-shift between the fundamental signal and the exponentiated compensation signal such that the linearity error distortion signals are canceled and the fundamental signal is maintained. The phase-shifting compensation parameters and the exponentiation compensation parameters are calibrated according to the measured amplitude and phase of the fundamental signal and linearity error distortion signals.

In another general aspect, the invention features a method of modeling linearity errors in a device generating a fundamental signal and linearity error distortion signals. The method includes steps of exponentiating a modeling signal to generate an exponentiated modeling signal, and phase-shifting the modeling signal or the exponentiated modeling signal to introduce a phase-shift between the fundamental signal and the exponentiated modeling signal. The phase-shift model parameters and the exponentiation model parameters are calculated according to the measured amplitude and phase of the fundamental signal and linearity error distortion signals.

BRIEF DESCRIPTION OF THE DRAWINGS

For a better understanding of the present invention, reference is made to the drawings which are incorporated herein by reference and in which.

DETAILED DESCRIPTION

The present invention is directed to methods and apparatus to reduce harmonic and intermodulation distortion in devices including, but not limited to, buffer or power amplifiers, analog-to-digital converters, digital-to-analog converters, sampling circuitry, or electro-mechanical devices such as microphones or loudspeakers. The present invention models the linearity errors with a mathematical phase-shift, exponential linearity model. The model can be used, for example, to predict the errors which can be subtracted from the output of the compensated system. The processing technique can be iterated multiple times to cancel residual errors. The present invention can be calibrated by optimizing the model parameters (for example, using a squared-error optimization) to provide maximal cancellation of the errors.

In one aspect, the present invention is directed to a linearity error compensation system for attenuating nonlinear errors introduced by signal processing devices. The linearity error compensation system develops a compensated output signal. The linearity error compensation system includes a device to be compensated and a linearity compensator. In one embodiment, the device receives the input signal and develops an output signal based on the input signal, and the linearity compensator attenuates errors introduced in the output signal by the signal processing device to develop the compensated output signal. In another embodiment, the linearity compensator develops a pre-compensated input signal, and the signal processing device processes the pre-compensated input signal to develop a compensated output signal.

In one embodiment, nonlinear errors introduced by the device are modeled using a phase-shift exponential model. In a further embodiment, the phase-shift exponential model is used to predict at least some of the nonlinear errors introduced by the signal processing device. In yet a further embodiment, the phase-shift exponential model is used to cancel at least some of the nonlinear errors introduced by the signal processing device by subtracting the predicted nonlinear errors from the input signal or the output signal. In a further embodiment, the cancellation is repeated at least once on the output of the linearity compensator to iteratively cancel errors introduced by the device. The attenuation may, for example, be repeated until the amplitudes of the errors fall below a predetermined threshold. The resulting system is the original system with a cascade of linearity compensators. The cascade may be collapsed into a single linearity compensator by mathematically evaluating the cascaded transfer function to calculate the equivalent linearity compensator factors for a single linearity compensator.

In another embodiment, the phase-shift exponential model models the device's behavior as one or more components corresponding to terms of an exponential equation. In a further embodiment, the phase-shifted exponential model may model the behavior of the signal processing device using selected orders of the exponential equation. Various other embodiments of the linearity error compensation system will be described in more detail below.

As described above, linearity errors can cause harmonic distortion and intermodulation distortion which can limit the performance of systems such as digital receivers for wireless communications, radar, laboratory test equipment, medical imaging, and audio/video compression. In one embodiment, the linearity error compensation system may be advantageously used to reduce harmonic distortion errors to improve the performance of devices such as analog-to-digital converters (ADCs), digital-to-analog converters (DACs), sample-and-hold circuitry, and buffer or power amplifiers. The linearity error compensation system may be used to improve the dynamic range of such devices, thereby enabling more accurate sampling and/or conversion of data at higher intermediate frequencies (IF), higher sampling rates, and/or higher resolutions.

Improving the speed and/or resolution of devices such as analog-to-digital converters enables wide bands of analog data to be converted to digital form and to be processed more accurately and efficiently than is possible in analog form. If the linearity error compensation system is implemented at least partially in software, systems incorporating such software may be updated more easily than a hardware-based system by updating the software as requirements change and new standards arise.

In one embodiment, the linearity error compensation system may be advantageously implemented without the use of a large amount of memory. In such an embodiment, the linearity error compensation system does not require a lookup table that maps actual outputs (or inputs) to desired outputs (or inputs). As described herein, the linearity error compensation system may use a phase-shift exponential model in which nonlinear errors introduced by a device are modeled using a relatively small number of parameters, such as phase-shift and amplitude. Implementation of such a system, therefore, does not require storage of large numbers of parameters and may therefore be implemented without a large memory.

A further advantage of the linearity error compensation system is that various embodiments of the system may easily be upgraded to compensate for nonlinear errors introduced by higher performance signal processing devices (e.g., ADCs and amplifiers) as they become available simply by re-calibrating the linearity error compensation system to model the linearity error profile of the new signal processing device.

In another embodiment, the linearity error profile of a device is modeled using a phase-shift exponential model in which both the phase and amplitude of nonlinear errors introduced by the signal processing device are modeled. This model may then also be used to cancel at least some of the nonlinear errors. The linearity error compensation system's use of phase in the modeling of nonlinear errors enables the linearity error compensation system to use less memory than approaches based on compensation tables and allows the linearity error compensation system to focus on the dominant linearity errors and ignore the other noise, which dilutes the accuracy of conventional error compensation systems.

In another embodiment, the linearity error compensation system may be used to attenuate errors corresponding only to selected orders of the phase-shift exponential equation used to model the nonlinearity profile of the signal processing device. Such selection is made possible by the use of the phase-shift exponential model, in which the nonlinear errors introduced by the signal processing device are separated into errors of different exponential orders. The orders may be selected according to any method, such as by selecting predetermined orders or by selecting orders based on a function of the severity of the errors introduced in each order. The linearity error compensation system may attenuate errors corresponding only to selected orders to advantageously increase the efficiency (e.g., size, speed, power consumption, and/or cost) of the linearity error compensation system.

In one embodiment, the linearity error compensation system may be advantageously implemented without requiring slope estimation, thus providing potential processing, size, and cost savings compared with conventional dynamic compensation approaches. In a further embodiment, the linearity error compensation system may be used to perform super-Nyquist error compensation (i.e., compensation of signals above the Nyquist frequency), thereby providing an advantage over conventional dynamic compensation approaches.

In yet a further embodiment, the linearity error compensation system may be used to reduce harmonic distortion at very high frequencies, enabling accurate processing (e.g., conversion) of data at higher intermediate frequencies than is achieved by conventional systems. Reduction of harmonic distortion at higher frequencies may be used to enable the reduction of the image rejection filter requirements and to reduce the complexity, of electronics such as that found in radio frequency (RF) receivers, thereby reducing cost, improving performance, and facilitating tasks such as single-chip integration.

In another embodiment, the linearity error compensation system cancels linearity errors without increasing noise in the compensated output signal (i.e., without decreasing the signal-to-noise ratio). In this way, the linearity error compensation system may provide an advantage over systems that decrease the signal-to-noise ratio by the introduction of noise into the system.

In another embodiment, the linearity error compensation system provides super-attenuation of linearity errors by using means for phase-shifting linearity error distortion signals with respect to the desired fundamental signal, which provides an advantage over systems that do not use phase-shifting.

In another embodiment, the linearity error compensation system uses frequency-dependent processing to provide cancellation of linearity errors whose characteristics (e.g., amplitude and phase) change with respect to frequency, which provides an advantage over systems that use frequency-independent processing.

In even another embodiment, the linearity error compensation system uses non-integer exponentiation to more accurately model the linearity errors (e.g., phase and amplitude) and provide greater cancellation of linearity errors whose characteristics change with input amplitude, which provides and advantage over systems that use integer polynomial power series processing.

Figure 2:
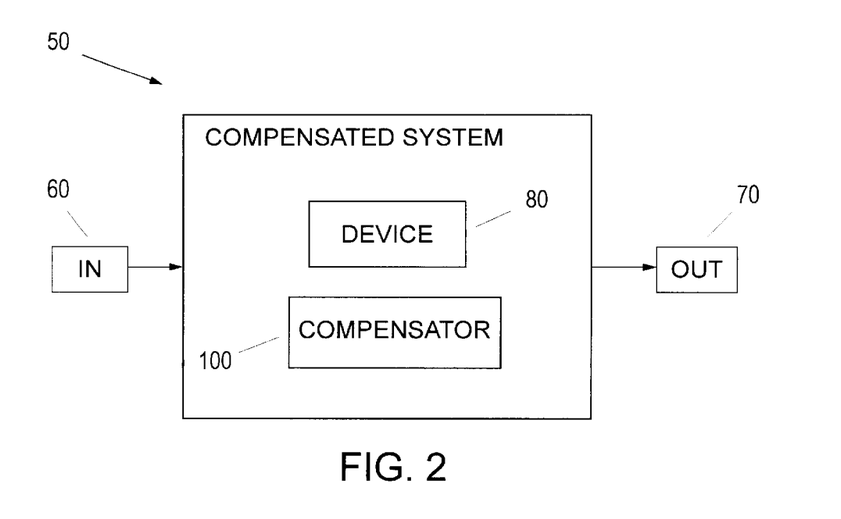
FIG. 2 is a block diagram of a compensated system using a compensator in accordance with an embodiment of the present invention.

Referring to FIG. 2, a compensated system 50 in accordance with the present invention consists of a device 80 exhibiting nonlinear distortion and a compensator 100 to compensate for the linearity errors. Nonlinear devices 80 generate undesired linearity error distortion signals in addition to the desired fundamental signal. The goal of the compensation system is to reduce the amplitude of the linearity error distortion signals while maintaining the fundamental signal. The compensated system 50 may, for example, be implemented in a post-compensation system 90 of FIG. 3 or a pre-compensation system 95 of FIG. 4.

Figure 5:
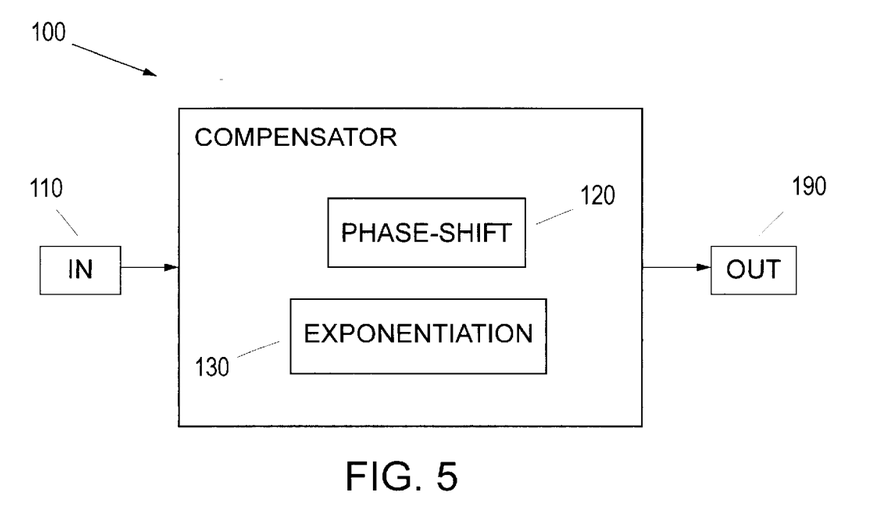
FIG. 5 is a block diagram of a compensator in accordance with still another embodiment of the present invention.

Referring to FIG. 5, embodiments of the present invention include, for example, means for phase-shifting 120 and means for exponentiation 130. Exponentiation 130 is used to generate linearity error distortion signals, the fundamental signal, or both; phase-shifting 120 is used to alter the phase of the linearity error distortion signals, the phase of the fundamental signal, or both. For example, the phase and amplitude of the distortion signals can be generated to be out-of-phase with the distortion signals generated by the device 80, and the phase and amplitude of the fundamental signal can be generated to be in-phase with the fundamental signal generated by the device 80, such that the linearity error distortion signals are canceled in the output 70 of the compensated system while maintaining the desired fundamental signal in the output 70.

The use of phase-shifting 120 in the present invention greatly simplifies the linearity model (requiring less memory than the prior art look-up tables) and it allows the compensator to focus on the dominant errors and ignore the other noise, which typically dilutes the accuracy of prior art systems. The present invention concentrates on the dominant components of the distortion to provide super-attenuationi of the undesired distortion while ignoring the other noise.

The compensator 100 cancels linearity error distortion signals (e.g., harmonic distortion and intermodulation distortion) for arbitrary wideband signals as well as sinusoidal signals. To simplify the computational requirements, only the dominant errors (for example, second and third order components) can be chosen to be canceled in the output. The invention provides an approach that is dynamic since it cancels errors for inputs across a wide range of frequencies (unlike prior art static look-up table techniques); the approach can use digital filters with a response that varies across frequency instead of using slope estimation to account for frequency-dependent errors more accurately than the prior art phase-plane compensation 10 of FIG. 1.

Figure 3:
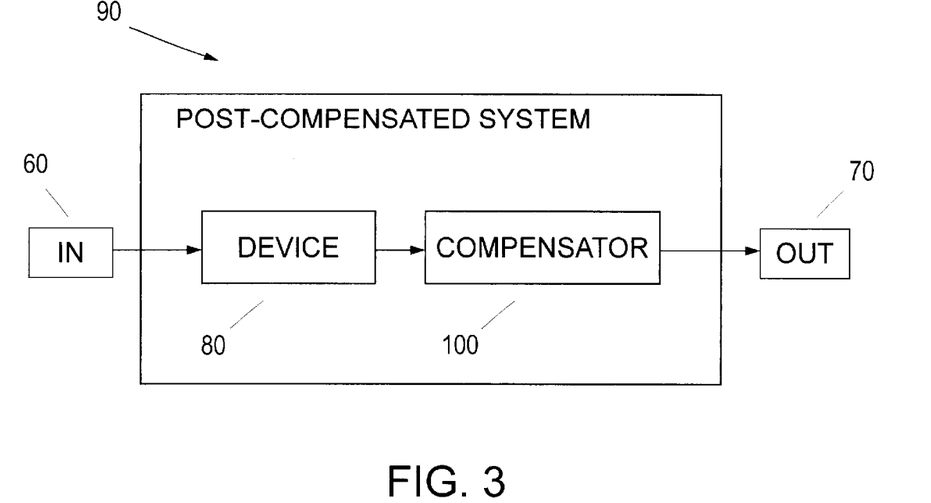
FIG. 3 is a block diagram of a compensated system using a post-compensator in accordance with another embodiment of the present invention.

Referring to FIG. 3, one embodiment of the compensator 100, for example, is for post-compensation of a device 80 where the compensator 100 follows the device 80 to be compensated. The device 80 receives an input signal 60; the output of the device 80 contains the desired fundamental signal plus undesired linearity error distortion signals. The compensator 100 receives the output of the device 80, processes the signal, and outputs a compensated signal 70. Post-compensated systems 90 are useful, for example, for using digital signal processing to perform the compensation on analog devices (such as amplifiers, sample-and-hold circuitry, analog-to-digital converters, or microphones) whose signals have been converted to digital format using an analog-to-digital converter.

Figure 8:
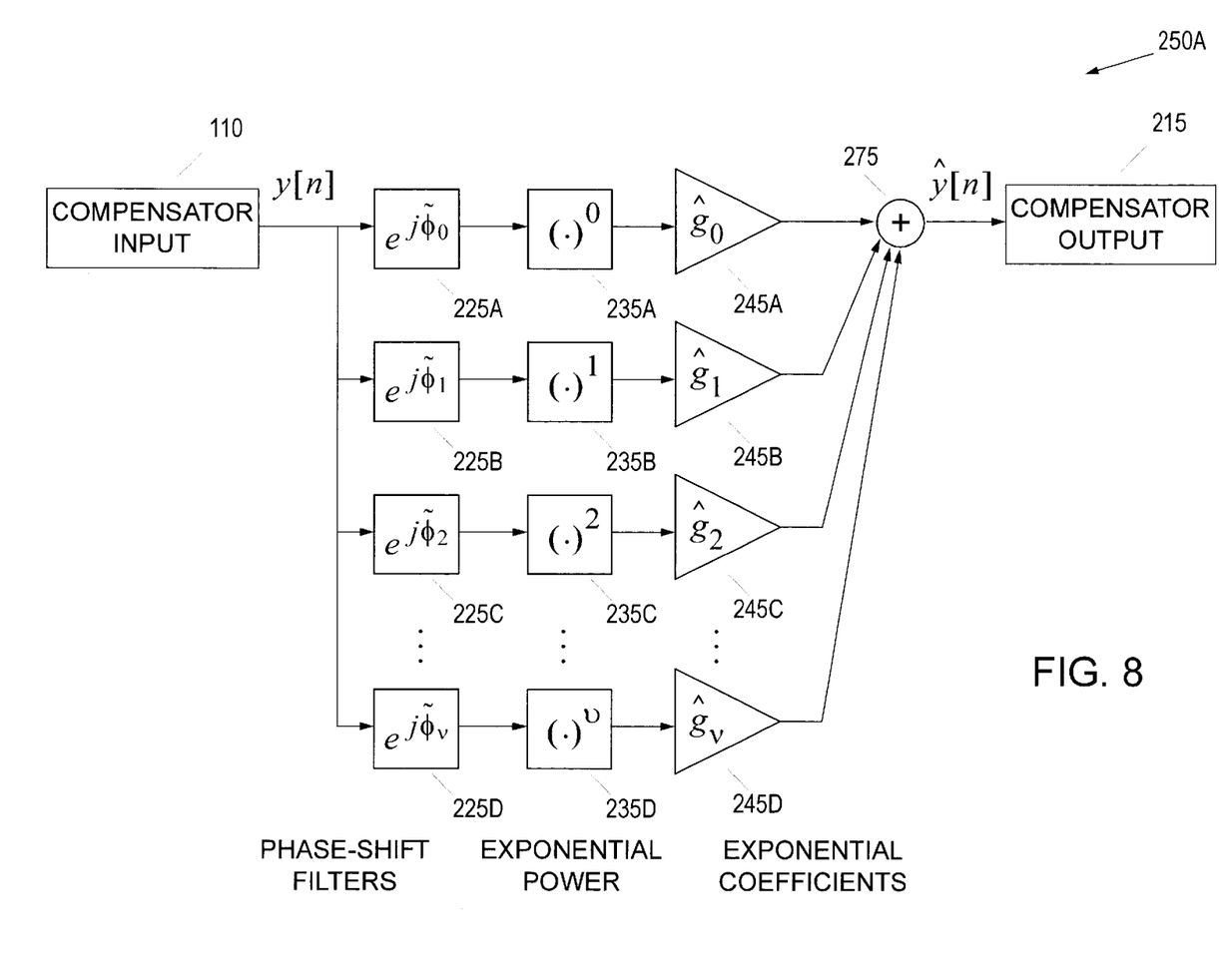
FIG. 8 is a more detailed block diagram of a direct power compensator in accordance with a preferred embodiment of the present invention.

Referring to FIG. 8, linearity errors are canceled by processing the output of the device 80 with a phase-shift exponential approach, for example, $$\hat{y}[n] = \sum_{v=0}^{N} \hat{g}_v (y[n] * \hat{p}_v[n])^v, \quad (1)$$

where y[n] is the input to the compensator 110, ŷ[n] is the compensator output 215, $\hat{g}_v$ are the exponential coefficients (245A, 245B, 245C, and 245D), v corresponds to the power exponentiation (235A, 235B., 235C, and 235D), $\hat{p}_v[n]$ is a filter impulse response that corresponds to a phase-shifter (225A, 225B, 225C, 225D), and N is the order of the phase-shift exponential compensator. The frequency response of $\hat{p}_v[n]$ is a phase shift, $P_v(e^{j\omega}) = e^{j\hat{\phi}_v}$, where $\hat{\phi}_v$ is the phase-shift.

Each term in the mathematical summation of Equation 1 corresponds to each processing arm in FIG. 8, where each processing arm may contain, for example, a phase-shifter (e.g., 225A), a power exponentiator (e.g., 235A), and an exponential coefficient (e.g., 245A). Each processing arm corresponds to either the fundamental signal, a linearity error distortion signal, or a combination of both. For example, the processing arm corresponding to the term in Equation 1 with the exponential v=1 corresponds to the fundamental signal and the processing arms corresponding to the remaining terms in the mathematical summation of Equation 1 represent the linearity error distortion signals. As discussed in detail below, a properly calibrated phase-shift exponential compensator, for example, will generate an in-phase fundamental signal and out-of-phase linearity error distortion signals such that the linearity error distortion signals are canceled in the output 70 of the compensated system.

Note that the power exponentials (e.g., 235D), a, in Equation 1 are not necessarily positive or integer numbers. For example, if a power exponential v=1.5 is chosen, then the corresponding processing arm for that term in the summation generates a combination of the fundamental signal and a linearity error distortion signal. As described in detail below, several such terms may be added 275, for example, to accurately generate an in-phase fundamental signal and out-of-phase linearity error distortion signals such that the linearity error distortion signals are canceled in the output 70 of the compensated system.

Referring back to FIG.3, in the post-compensation system 90, linearity errors in a device 80 can be modeled, for example, with a phase-shift exponential model, $$y[n] = \sum_{v=0}^{\infty} g_v (x[n] * p_v[n])^v, \quad (2)$$

where y[in] is the output of the device 80, x[n] is the input to the device 80, $g_v$ are the exponential coefficients in the model, v corresponds to exponentiation, and $p_v[n]$ is an impulse response that corresponds to the phase-shift of each exponential factor. The frequency response of $p_v[n]$ is a phase-shift, $P_v(e^{j\omega}) = e^{j\phi_v}$ where $\phi_v$ are the phase shifts of the exponential factors.

Referring again to FIG. 8, the compensator 100 can be calibrated (as described in detail below), for example, by choosing the exponential coefficients $\hat{g}_v$ (245A, 245B, 245C, and 245D) to be the negative of the exponential coefficients measured in the device 80 model described by Equation 2

$$\hat{g}_v = -g_v \text{ for } v \neq 1 \text{ and } \hat{g}_1 = g_1, \quad (3)$$

and the phase-shifters (225A. 225B, 225C. 225D) to have the same phase-shifts measured in the device 80 model $$\hat{\phi}_v = \phi_v. \quad (4)$$

In other words, the phase-shift exponential compensator generates an in-phase fundamental signal (since its phase-shift and amplitude is chosen to be the same as that measured in the device 80, $\hat{\phi}_1 = \phi_1$ and $\hat{g}_1 = \hat{g}_1$), and the phase-shift exponential compensator generates out-of-phase linearity error distortion signals (since their phase-shifts are chosen to be the same as those measured in the device 80 but their amplitudes are chosen to be the negative of those measured in the device 80, $\hat{\phi}_v = \phi_v$ and $\hat{g}_v = -g_v$ for $v \neq 1$); therefore, the linearity error distortion signals are canceled in the output 70 of the compensated system. Referring back to FIG. 3, the input of the compensator 100 is operatively coupled to the output of the device 80. Equation 2 describes the output of the device 80, and Equation 1 describes the output of the compensator 100; substituting Equation 2 into Equation 1 and using the phase-shifts in Equation 3 yields the compensator output 70

$$\hat{y}[n] = \sum_{v=0}^{N} \hat{g}_v \left( \left( \sum_{k=0}^{\infty} g_k (x[n] * p_k[n])^k \right) * p_v[n] \right)^v. \quad (5)$$

Since the phase-shifts are relative to the fundamental signal, the phase-shift of the fundamental component can be set to zero, $\phi_v = 0$, with no loss of generality. It is assumed that the device 80 to be compensated exhibits linearity errors with amplitude much smaller than the fundamental signal (this is true for all devices except those exhibiting very large nonlinear distortion), $$g_v << g_1 \text{ for } v \neq 1. \quad (6)$$

Therefore, many cross-product terms in Equation 5 are negligible, $$\hat{y}[n] \approx \hat{g}_0 + g_0 + x[n] + \sum_{k=2}^{\infty} g_k (x[n] * p_k[n])^k + \sum_{v=2}^{\infty} \hat{g}_v (x[n] * p_k[n])^v. \quad (7)$$

Referring to both FIG. 8 and FIG. 3, using the example solution for the compensation coefficients $\hat{g}_v$ in Equation 3, the linearity error distortion signals cancel when they are summed 275 and the compensated output 215 accurately represents the original input to the device 80, $$\hat{y}[n] \approx x[n]. \quad (8)$$

Figure 4:
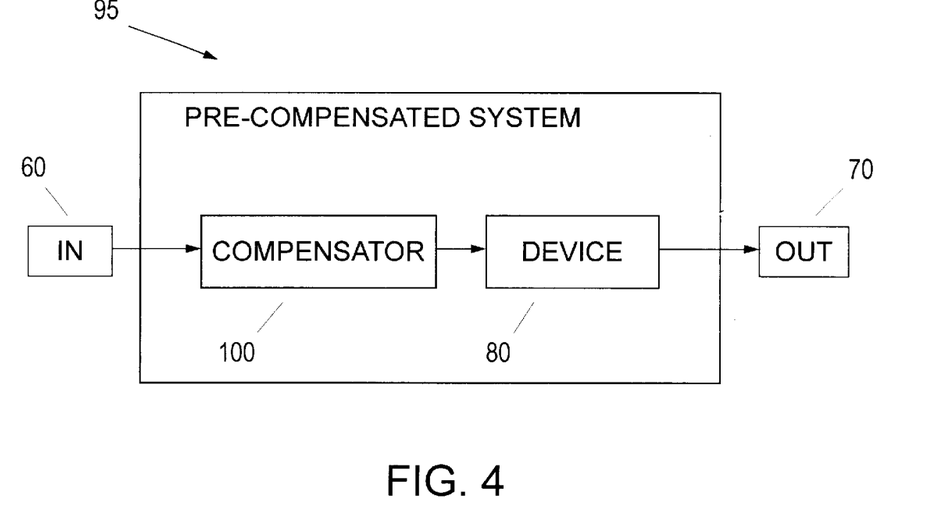
FIG. 4 is a block diagram of a compensated system using a pre-compensator in accordance with yet another embodiment of the present invention.

Referring to FIG. 4, another embodiment of the compensator 100, for example, is for pre-compensation of a device 80 where the compensator 100 precedes the device 80 to be compensated. Pre-compensated systems 95 are useful, for example, for using digital signal processing to perform the compensation on analog devices (such as amplifiers, digital-to-analog converters, or loudspeakers) whose signals will be converted to analog format using a digital-to-analog converter. Linearity error distortion signals are canceled by pre-processing the input signal 60 with a phase-shift exponential approach as described above (e.g., as shown in FIG. 8), such that the linearity error signals are canceled in system output 70.

The compensation approach for pre-compensation 95 in FIG. 3 is analogous to that for post-compensation 90 of FIG. 4 as discussed above. As discussed in detail below, a properly calibrated phase-shift exponential compensator, for example, will generate an in-phase fundamental signal and out-of-phase linearity error distortion signals such that the linearity error distortion signals are canceled in the output 70 of the compensated system.

Figure 6:
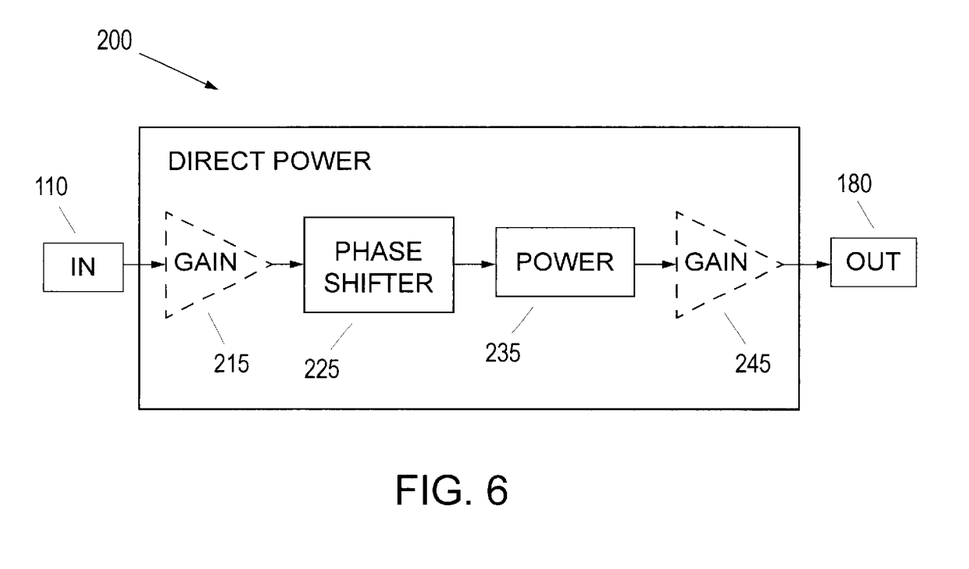
FIG. 6 is a block diagram of a direct power portion of a compensator in accordance with a preferred embodiment of the present invention.
Figure 7:
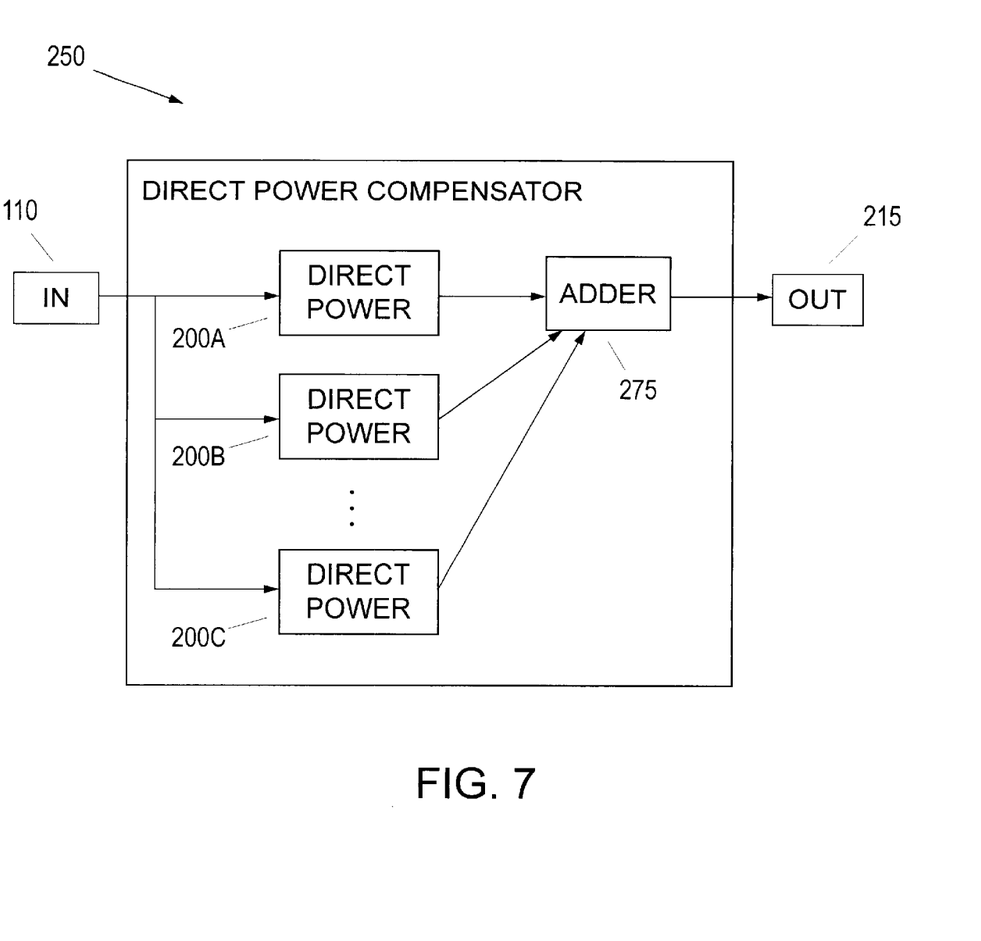
FIG. 7 is a block diagram of a direct power compensator in accordance with a preferred embodiment of the present invention and further illustrated in FIG. 6.
Figure 9:
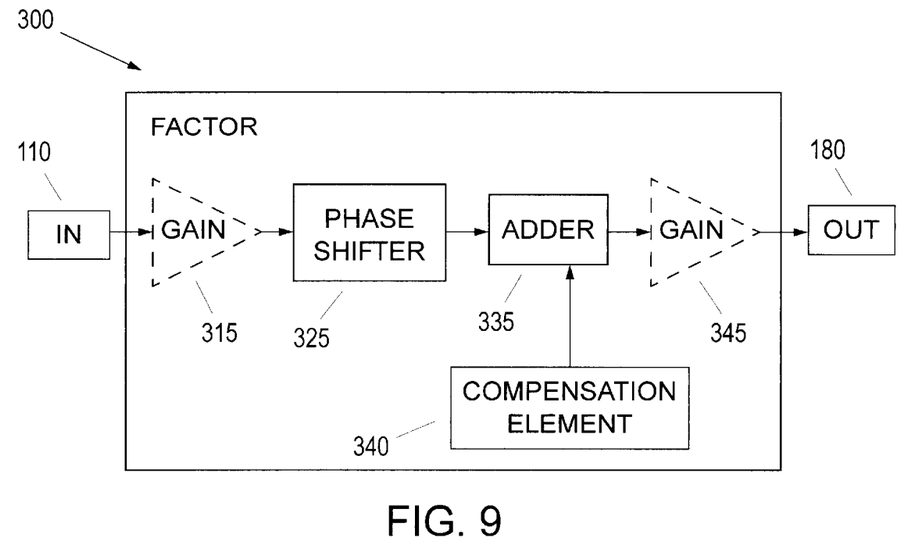
FIG. 9 is a block diagram of a factor portion of a compensator in accordance with another embodiment of the present invention.
Figure 10:
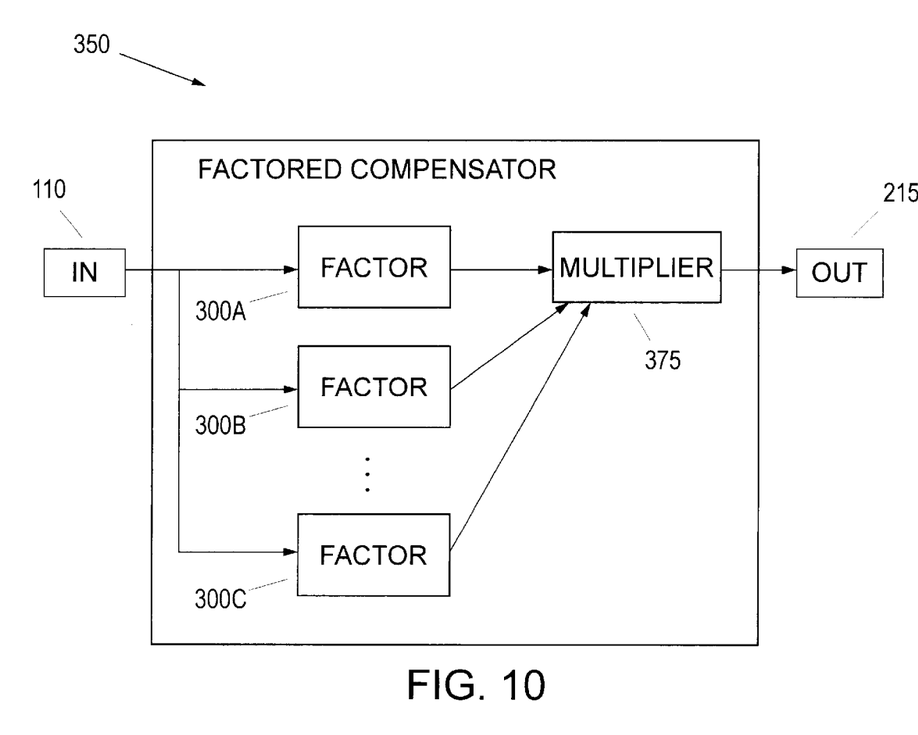
FIG. 10 is a block diagram of a factored compensator in accordance with another embodiment of the present invention and further illustrated in FIG. 9.
Figure 11:
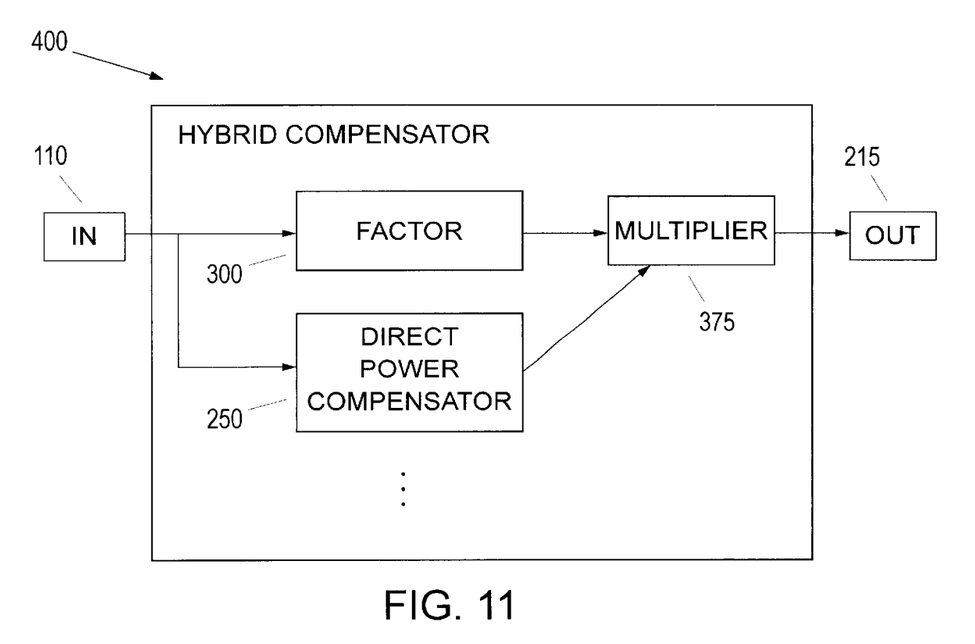
FIG. 11 is a block diagram of a hybrid compensator in accordance with yet another embodiment of the present invention.

The phase-shift exponential compensator 100 can be implemented using several techniques, including, but not limited to, a direct power technique (as shown in FIG. 6 and FIG. 7), a factored technique (as shown in FIG. 9 and FIG. 10), or a hybrid of these techniques (as shown in FIG. 11). Each of these approaches can be implemented using several techniques, including, but not limited to, software on a computing processor, firmware on a digital signal processor, digital hardware electronics, analog hardware electronics, or a combination of these techniques.

Referring to FIG. 6 and FIG. 7, a preferred embodiment of the invention uses one or more direct power portions 200 in parallel to generate the fundamental signal and the linearity error signals, and the outputs of each portion can be summed 275 to form the compensator output 215 such that the linearity error signals are canceled and the fundamental signal is maintained in the compensated system output 70. The direct power compensator 250 implements the phase-shift exponential compensation approach described by Equation 1 by directly calculating the exponential portions 200 and summing 275 them together.

FIG. 6 shows a direct power portion 200 of a compensator. Each direct power portion 200 contains of a phase-shifter 225, a power exponentiator 235, and optionally amplitude factors 215 or 245. The direct power portion 200 generates the fundamental signal or the linearity error distortion signals or a combination of both, for example, as described by the term within the summation in Equation 1, $$\hat{g}_v(y[n]*\hat{p}_v[n])^v, \qquad (9)$$

where j[n] is the input 110 to the compensator 100, $\hat{g}_v$ are the exponential coefficients 245, v corresponds to the exponentiator 235, $\hat{p}_v[n]$ is a filter impulse response that corresponds to the phase-shifter 225. The frequency response of $\hat{p}_v[n]$ is a phase shift, $P_v(e^{j\omega})=e^{j\phi_v}$, where $\phi_v$ is the phase-shift. Note that the exponentials 235, v, are not necessarily positive or integer numbers, as discussed above.

Note that the phase-shifts 225 $\phi_v$ may have a phase delay that varies with signal frequency to compensate linearity errors whose response varies with frequency. Also, the exponential coefficients 245 may have gain that varies with signal frequency to compensate linearity errors whose response varies with frequency. The exponential coefficients 215 and 245 can be implemented, for example, with finite impulse response or infinite impulse response filters, with digital hardware (such as the Graychip 2011 digital filter chip), in software, or in firmware. Similarly, the phase-shifter 225 can be implemented, for example, with finite impulse response or infinite impulse response filters, with digital hardware, in software, or in firmware. The power exponentiator 235 has a response $$y=x^v \qquad (10)$$

where x is the input to the power exponentiator 235, is the output of the power exponentiator 235, and v is the exponential, which is not necessarily a positive integer. The power exponentiator 235 can be implemented, for example, with a set of multipliers.

Referring to FIG. 9 and FIG. 10, another embodiment of the invention uses one or more factor portions 300 in parallel, with the outputs of each portion multiplied 375 to form the compensator output 215 such that the linearity error signals are canceled and the fundamental signal is maintained in the compensated system output 70. The factored compensator 375 implements the phase-shift exponential compensation approach described by Equation 1 by factoring the exponential into first order factors 300 which are multiplied 375 together to form the output 215. The exponentiation is accomplished via the multiplication 375 of the factors 300.

FIG. 9 shows a factor portion 300 of a compensator. Each factor portion 300 consists of a phase-shifter 325, an adder 335, and optionally gain factors 315 and 345. The factor portion 300 can generate, for example, the first order mathematical factors of Equation 1. Note that the phase-shifts 325 $\phi_v$ may have a phase delay that varies with signal frequency to compensate linearity errors whose response varies with frequency. Also, the gain coefficients 315 and 345 may have gain that varies with signal frequency to compensate linearity errors whose response varies with frequency. The gain coefficients 315 and 345 can be implemented, for example with finite impulse response or infinite impulse response filters, with digital hardware (such as the Graychip 2011 digital filter chip), in software, or in firmware. Similarly, the phase-shifter 325 can be implemented, for example, with finite impulse response or infinite impulse response filters, with digital hardware, in software, or in firmware.

In accordance with an alternate embodiment of the current invention. FIG. 11 shows a hybrid compensator 400, which combines the direct power compensator 250 with factor portions 300, which are multiplied 375 together to form the compensator output 215. Instead of using only single order factor portions 300, the hybrid compensator 400 can employ a combination of single order factor portions 300 and higher-order direct power compensator factors 250.

Embodiments of the current invention may use a filter bank to partition the frequency spectrum of the device 80 to be compensated into smaller frequency bands which are each processed with a separate compensator 100; this is useful if the linearity errors change significantly as a function of input signal frequency.

Embodiments of the current invention may use a conditional compensator 100, which only activates the compensation processing when linearity errors exceed a prescribed threshold. For example, typical devices exhibit higher linearity errors when the signal amplitude is increased, so a conditional compensator 100 may activate the processing only above a certain amplitude. Additionally, different conditional compensators may be activated when the amplitude is within certain amplitudes, for example, if the linearity errors change significantly as a function of input signal amplitude.

Figure 12:
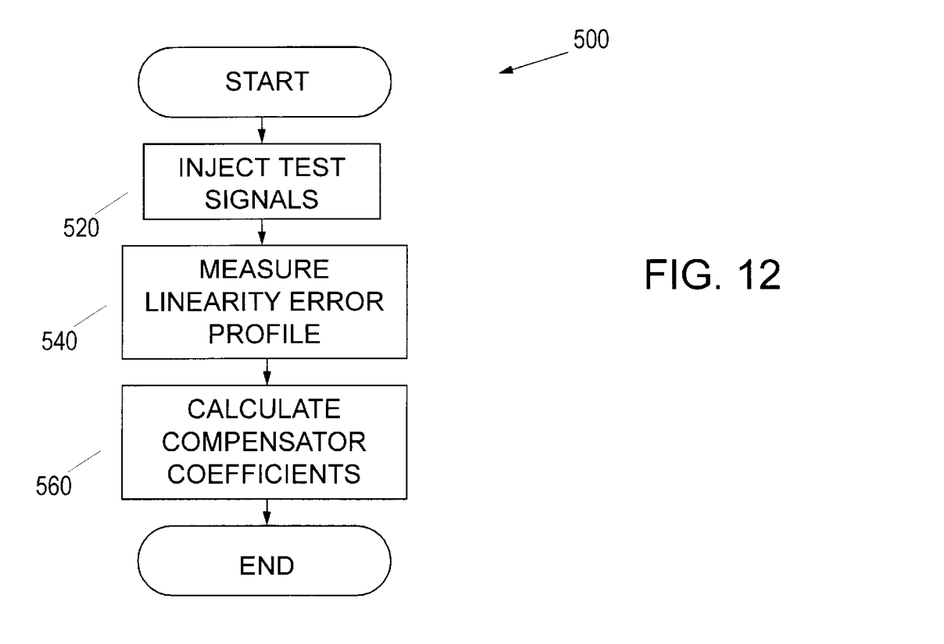
FIG. 12 is a flow chart showing a process for calibrating compensators in accordance with the present invention.

Referring to FIG. 12 and FIG. 2, the compensator 100 can be calibrated, for example, by injecting known test signals 500 on the input 60 of the system to measure the linearity error profile 540 of the device 80 for a wide range of input amplitudes and frequencies covering the operating range of the system 50. The known test signals, for example, may be pure sinusoidal signals of varying frequencies, or dual-tone signals, or multi-tone comb signals. Measurement 540 of the linearity error profile of the device 80 consists, for example, of measuring the amplitude and phase-shift of the fundamental signal and the linearity error distortion signals (e.g., harmonic distortion and intermodulation distortion). The amplitudes and phase-shifts can be measured, for example, by taking the Discrete Fourier Transform of the output of the device 80. As described in detail below, these amplitudes and phase-shifts can be used to calculate the phase-shifts $\phi_v$, exponential coefficients $g_v$, and exponentials v in the model of the device 80 described by Equation 2 above. As described in detail below, the compensator coefficients for the compensator 100, are calculated 560 such that the linearity error distortion signals are canceled in the output 70 of the compensated system while maintaining the desired fundamental signal in the output 70. The compensator coefficients consist, for example, of the phase-shifts $\hat{\phi}_v$, exponential coefficients $\hat{g}_v$, and exponentials v in the phase-shift exponential compensator described by Equation 1 above.

Since the linearity error profile of typical electronic devices is relatively constant, re-calibration of the compensator can be performed infrequently, for example, when the system hardware is reconfigured. An auto-calibration procedure can be implemented by using pseudorandom comb signals to quickly generate a broadband model. Systems incorporating the compensator 100 can be upgraded to higher performance as new devices 80 become available by re-calibrating the compensator 100 to compensate the new hardware configuration.

Figure 13:
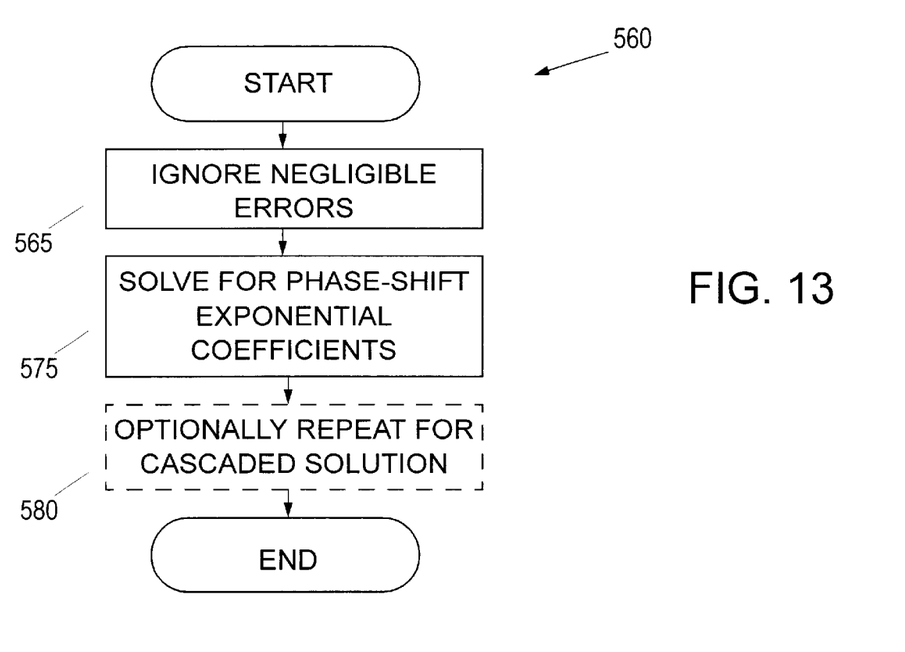
FIG. 13 is a flow chart showing a step for calculating compensator coefficients of FIG. 12 in accordance with the present invention.

FIG. 13 shows a flowchart for a method to calculate 560 the compensator coefficients (e.g., the phase-shifts $\hat{\phi}_v$, exponential coefficients $\hat{g}_v$, and exponentials v in the phase-shift exponential compensator described by Equation 1 above.). The measured linearity error profile 540 of the device 80 is examined and negligible linearity errors are ignored 565, for example, if their amplitudes are below a prescribed threshold (e.g., −80 dBc for a system with 12-bit resolution). The remaining non-negligible linearity errors are used to calculate the compensator coefficients.

As discussed above, measurement of the linearity error profile of the device 80 consists, for example, of measuring the amplitude and phase-shift of the fundamental signal and the linearity error distortion signals (e.g., harmonic distortion and intermodulation distortion). This can be accomplished by injecting a sinusoidal signal into the device 80 and measuring the amplitude and phase-shift of the harmonic distortion signals in the output, y[n], of the device 80

$$y[n] = \sum_{k=0}^{\infty} A_k \cos(\omega_1 k n + \hat{\phi}_k), \quad (11)$$

where $A_k$ is the amplitude of the $k^{th}$ harmonic and $\hat{\phi}_k$ is the phase shift of the $k^{th}$ harmonic. The harmonic amplitudes $A_k$ and harmonic phase-shifts $\hat{\phi}_k$ can be measured by taking the Discrete Fourier Transform of the output of the device 80. By injecting a sinusoidal signal in the input to the device 80 (i.e., setting the input in Equation 2 to be a sinusoidal signal x[n]=cos($\omega_1$n)) and equating like terms with Equation 11, the model's exponential coefficients, $g_v$, and model's phase-shifts, $\phi_v$, can be determined as functions of the measured harmonic amplitudes $A_k$ and harmonic phase-shifts $\hat{\phi}_k$. With the sinusoidal input, Equation 2 becomes, for example, $$y[n] = \sum_{v=0}^{\infty} g_v \cos^v(\omega_1 n + \hat{\phi}_k). \quad (12)$$

To equate terms with Equation 11, trigonometric identities can be used to convert powers of sinusoidal functions to sinusoidal functions of harmonics; for example, the double-angle formula is $$\cos^2(\alpha) = \tfrac{1}{2} + \tfrac{1}{2}\cos(2\alpha) \quad (13)$$

Specific harmonics can be chosen to be compensated while others are ignored by assuming the amplitudes $A_k$ of harmonics to be ignored 565 are zero.

One solution 575 to effectively cancel the linearity error distortion signals, for example, is choose the exponential coefficients $\hat{g}_v$ to be the negative of the exponential coefficients measured in the device 80 model described by Equation 2

$$\hat{g}_v = -g_v \text{ for } v \neq 1 \text{ and } \hat{g}_1 = g_1, \quad (14)$$

and the phase-shifters to have the same phase-shifts measured in the device 80 model $$\hat{\phi}_v = \phi_v. \quad (15)$$

Therefore, the linearity error distortion signals are canceled in the output 70 of the compensated system.

Optionally, the solution 575 can be repeated 580 to compensate for residual linearity errors that still remain. This can be repeated, for example, until all the linearity errors are below a prescribed threshold. The resulting, system is a cascade of compensators 100. The cascade can be optionally collapsed into a single compensator 100 by mathematically evaluating the cascaded transfer function to calculate the equivalent single compensator 100. For example, M cascaded compensators 100 (each with order N; the highest exponential order in the system is V) is equivalent to one compensator of order $M^N$. The resulting compensator 100 can be optionally simplified by discarding negligible terms.

Figure 14:
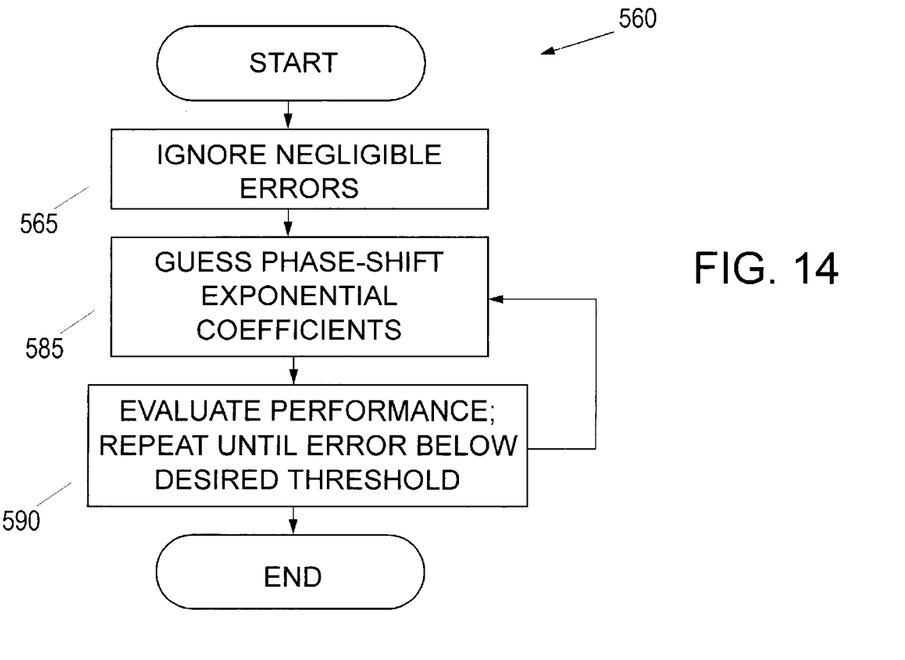
FIG. 14 is a flow chart showing an alternative step for calculating compensator coefficients of FIG. 12 in accordance with the present invention.

FIG. 14 shows a flowchart for an alternate method to calculate 560 the compensator coefficients. Negligible linearity errors are ignored 565, for example, if their amplitudes are below a prescribed threshold (for example. 80 dB for a system with 12-bit resolution). Standard optimization techniques (for example, mean-squared error optimizations), can be used to guess 585 the compensator coefficients, evaluate the performance 590, and iteratively or non-iteratively repeat the optimization until the linearity errors are below a prescribed threshold. The performance can be evaluated 590, for example, by determining the level of the linearity error distortion signals in the system output 70.

Various embodiments of the linearity error compensator have a number of useful applications. For example, in one embodiment the linearity error compensator may be used to generate new communications signals that linearize a non-linear system, thereby increasing signaling capacity. These new communications signals may have the behavior of eigenfunctions of nonlinear systems. A comb-like signal may be used as an input to the linearity error compensation system, which outputs a phase-shifted, scaled version of the input. Such an embodiment of the linearity error compensation system may, for example, be used in conjunction with digital subscriber line (DSL) modems. In one embodiment, the linearity error compensator may be used to increase signaling capacity in a communications system or to improve the efficiency of signal compression. In another embodiment, the linearity error compensation system may be used to reduce harmonic and intermodulation distortion in any of a variety of devices, such as buffer or power amplifiers, analog-to-digital converters, digital-to-analog converters, and sampling circuitry.

In a further embodiment, the linearity error compensator system may be used to improve communications systems by increasing modulation density (thereby increasing system capacity). In another embodiment, the linearity error compensator may be used to reduce the bit error rate for communications (such as modems, cellular telephones, or satellite systems). In yet a further embodiment. Quadrature Amplitude Modulation (QAM) density is improved by decreasing linearity errors.

Other applications of the linearity error compensation system include noise cancellation; reduction of linearity errors caused by microphones (to enhance speech processing); attenuation of linearity errors caused by audio amplifiers and speakers; pre-compensation processing (e.g., in a tape-monitor loop) to reduce distortion introduced by the cone and voice coil of speaker drivers and power amplifier nonlinearities; and data compression (e.g., for audio, video, or still picture compression).

Embodiments of the present invention provide significant advantages and overcome drawbacks of the prior art.

It is to be understood that the term ";device" as used herein is not limited to physical devices or to devices or processes that act upon electrical signals. Rather, the term "device" as used herein includes any device, process, software, or combination thereof that outputs a signal that includes linearity error distortion. Such signal processing devices include, for example, sample-and-hold circuitry, buffer or power amplifiers, analog-to-digital and digital-to-analog converters, and other digital, analog, and mixed analog-and-digital devices.

Furthermore, it should be understood that the term "signal" as used herein is not limited to electrical signals. Rather, the term "signal" as used herein includes any signal travelling through any tangible medium and any sequence of information, whether continuous or discrete in time, amplitude, or any other parameter. For example, the term "signal" as used herein includes, but is not limited to, medical electrocardiogram signals, fingerprints, photographs, audio signals, and video signals.

The linearity error compensator described herein is not limited to use in conjunction with any particular device or other device, software, system, process, or combination thereof. Illustrative examples of systems in which embodiments of the linearity error compensation system may be used include, but are not limited to: smart radios for wireless communications (cellular and satellite); radar systems; medical imaging systems such as ultrasound, MRI, CT Scan, PET Scan, and x-ray; sonar systems; test equipment such as oscilloscopes, spectrum analyzers, and network analyzers; wide bandwidth modems; audio recording and signal processing; speech processing; high-definition television (HDTV); audio and video compression systems; dynamic feedback and control systems; scientific equipment such as microscopes; and imaging hardware in astronomy.

It is to be understood that although the invention has been described above in terms of particular embodiments, the foregoing embodiments are provided as illustrative only, and do not limit or define the scope of the invention. Other embodiments are also within the scope of the present invention, which is defined by the scope of the claims below.

The techniques described above may be implemented, for example, in hardware (including analog and/or digital circuitry), software, firmware, or any combination thereof. For example, the linearity error compensator and elements thereof may be implemented in analog or digital circuitry, a Very large Scale Integrated Circuit (VLSI), a Digital Signal Processor (DSP) chip, or any combination thereof. The techniques described above may be implemented in one or more computer programs executing on a programmable computer including a processor, a storage medium readable by the processor (including, for example, volatile and nonvolatile memory and/or storage elements), at least one input device, and at least one output device. Program code may be applied to data entered using the input device to perform the functions described and to generate output information, the output information may be applied to one or more output devices.

Each computer program may be implemented in any programming language, such as assembly language, machine language, a high-level procedural programming language, or an object-oriented programming language. The programming language may be a compiled or interpreted programming language.

Each computer program may be implemented in a computer program product tangibly embodied in a machine-readable storage device for execution by a computer processor. Method steps of the invention may be performed by a computer processor executing a program tangibly embodied on a computer-readable medium to perform functions of the invention by operating on input and generating output. Suitable processors include, by way of example, both general and special purpose microprocessors. Generally, the processor receives instructions and data from a read-only memory and/or a random access memory. Storage devices suitable for tangibly embodying computer program instructions include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits). A computer can generally also receive programs and data from a storage medium such as an internal disk or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

Although elements of the invention may be described herein in terms of a software implementation, aspects of the invention may be implemented in software, hardware, firmware, or any combination thereof.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method for adaptively calibrating a compensation system that cancels linearity error distortion signals generated by a device and maintains a fundamental signal generated by the device, the method of calibrating comprising steps of:

measuring the amplitude and phase of the linearity error distortion signals and the fundamental signal; and calculating a set of compensator coefficients;

wherein the step of calculating the set of compensator coefficients includes solving for a set of phase-shifting compensation parameters and a set of exponentiator compensation parameters.

2. The method of claim 1 wherein the step of calculating the set of compensator coefficients further includes a step ignoring linearity error distortion signals with amplitudes smaller than a pre-determined threshold.

3. The method of claim 1 wherein the step of calculating the set of compensator coefficients further includes a step of repeating the step of calculating the set of compensator coefficients to generate a plurality of sets of compensator coefficients for a cascaded compensator.

4. The method of claim 3 further comprising a step of mathematically combining the plurality of sets of compensator coefficients into a single combined set of compensator coefficients for a non-cascaded compensator having substantially the same performance as the cascaded compensator.

5. The method of claim 1 wherein the step of calculating a set of compensator coefficients further includes a step of setting the phase-shifting compensation parameters to be substantially equivalent to the measured phase of the linearity error distortion signals and setting the amplitudes of the corresponding exponentiator compensation parameters to be the approximate negative of the measured amplitude of the linearity error distortion signal.

6. The method of claim 1 wherein the step of calculating a set of compensator coefficients includes iteratively optimizing the set of phase-shifting compensation parameters and the set of exponentiator compensation parameters.

7. The method of claim 1 wherein the steps are performed without interrupting the normal compensation operation of the compensator system.

* * * * *